United States Patent
Winkler et al.

(10) Patent No.: US 11,849,718 B2
(45) Date of Patent: Dec. 26, 2023

(54) PARTICLE HAVING AN ANTIMICROBIAL SURFACE, MATERIAL FOR PRODUCING A COATING USING SUCH PARTICLES, AND METHOD FOR PRODUCING SUCH PARTICLES

(71) Applicant: Siemens Aktiengesellschaft, Munich (DE)

(72) Inventors: Gabriele Winkler, Berlin (DE); Christian Doye, Berlin (DE); Jens Dahl Jensen, Berlin (DE); Manuela Schneider, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 685 days.

(21) Appl. No.: 17/046,898

(22) PCT Filed: Feb. 28, 2019

(86) PCT No.: PCT/EP2019/054949
§ 371 (c)(1),
(2) Date: Oct. 12, 2020

(87) PCT Pub. No.: WO2019/197076
PCT Pub. Date: Oct. 17, 2019

(65) Prior Publication Data
US 2021/0144994 A1 May 20, 2021

(30) Foreign Application Priority Data

Apr. 13, 2018 (EP) .................................... 18167217

(51) Int. Cl.
*A01N 25/26* (2006.01)
*A01N 59/16* (2006.01)
*B01J 8/24* (2006.01)
*C23C 16/40* (2006.01)
*C23C 16/44* (2006.01)

(52) U.S. Cl.
CPC ............. *A01N 25/26* (2013.01); *A01N 59/16* (2013.01); *B01J 8/24* (2013.01); *C23C 16/40* (2013.01); *C23C 16/4417* (2013.01)

(58) Field of Classification Search
CPC ......... C01B 35/04; B01J 23/002; B01J 23/08; B22F 1/09; B82Y 5/00; C04B 35/00; A61L 31/16; A61L 31/146; A61L 31/082
USPC ........ 162/208; 424/489, 1.11, 423; 428/403, 428/402
See application file for complete search history.

(56) References Cited

U.S. PATENT DOCUMENTS

| 6,716,525 B1* | 4/2004 | Yadav ...................... B82Y 5/00 502/224 |
| 2003/0102099 A1* | 6/2003 | Yadav ..................... C01B 35/04 162/212 |
| 2009/0028785 A1* | 1/2009 | Clarke .................... A61L 31/16 424/1.11 |
| 2011/0229728 A1 | 9/2011 | Doye ........................... 428/469 |

FOREIGN PATENT DOCUMENTS

| EP | 2 933 230 | 10/2015 | ........... C01G 23/053 |
| WO | 2010 057969 | 5/2010 | ............. A01N 59/16 |

OTHER PUBLICATIONS

Search Report for International Application No. PCT/EP2019/054949, 12 pages, dated Apr. 8, 2019.
Search Report for EP Application No. 18167217.1, 7 pages, dated Oct. 10, 2018.
Davies R. et al: "Engineered Particle Surfaces", Advanced Materials, Wiley-VCH Germany, DE, vol. 10, No. 15, 7 pages, XP000783195, ISSN: 0935-9648, 1998.
Zhiqiang Zhang et al: "Facile Synthesis Of ATO/MnO$_2$ Core-Shell Architectures For Electrochemical Capacitive Energy Storage", Ceramics International, Bd. 40, Nr. 7, 0309-10315, XP028651260, ISSN: 0272-8842, 7 pages, 2014.

* cited by examiner

*Primary Examiner* — Walter E Webb
(74) *Attorney, Agent, or Firm* — Slayden Grubert Beard PLLC

(57) ABSTRACT

Various embodiments include particles comprising an antimicrobial surface and a layer comprising antimony-tin oxide and manganese oxide.

11 Claims, 3 Drawing Sheets

PARTICLE HAVING AN ANTIMICROBIAL SURFACE, MATERIAL FOR PRODUCING A COATING USING SUCH PARTICLES, AND METHOD FOR PRODUCING SUCH PARTICLES

CROSS-REFERENCE TO RELATED APPLICATIONS

This application is a U.S. National Stage Application of International Application No. PCT/EP2019/054949 filed Feb. 28, 2019, which designates the United States of America, and claims priority to EP Application No. 18167217.1 filed Apr. 13, 2018, the contents of which are hereby incorporated by reference in their entirety.

BACKGROUND

The present disclosure relates to particles with an antimicrobial surface. Various embodiments of the teachings herein include materials for producing a coating and/or processes for producing particles having an antimicrobial surface.

BACKGROUND

Surfaces having an antimicrobial action have hitherto been formed by spherical particles. Here, the antimicrobially acting metals, metal oxides or metal oxide mixtures are frequently processed to give nanoparticles and then mixed into paints, surface coating compositions or polymer materials. These antimicrobially acting particles can utilize the UV component of light in order to form germ-killing materials. On the other hand, antimicrobial surfaces are produced on the basis of the electrochemical behavior of metals which form microelectrochemical cells in the presence of moisture and due to the microelectric fields display a germ-killing effect.

These metals are either electrodeposited or applied by physicochemical processes (PVD, CVD, sputtering or sol-gel processes).

SUMMARY

The present disclosure describes particles having a microbial effect and also materials having an antimicrobial action, by means of which a good microbial effect can be achieved independently of the ambient conditions as well as processes for producing such antimicrobial particles. For example, some embodiments include articles having an antimicrobial surface, characterized in that the particles are equipped with a layer (12, 13) which contains both antimony-tin oxide and manganese oxide.

In some embodiments, the particles have the form of flakes and/or platelets and/or needles (11).

In some embodiments, the layer +11 consists of an inner sublayer (12) of antimony-tin oxide and a porous outer sublayer (13) of manganese oxide.

As another example, some embodiments include a material for producing a coating or a component, comprising a matrix material and particles (16) for embedding in a matrix to be formed from the matrix material, characterized in that the particles (16) have the structure as described herein.

In some embodiments, the matrix material consists of a granulated polymer.

In some embodiments, the particles (16) are attached to the surface of the granulated polymer.

In some embodiments, the matrix material consists of a surface coating composition in which the particles (16) are dispersed.

In some embodiments, the matrix material is present in ionized form in an electrolyte, with the particles (16) being dispersed in the electrolyte.

As another example, some embodiments include a process for producing particles as described herein, characterized in that particles coated with antimony-tin oxide are used and these are wet-chemically coated with manganese oxide using a symproportionation-precipitation process, with the following steps being run through in the order indicated: suspension of the particles (16) in water, introduction of the particle suspension obtained in this way into a manganese (II) nitrate solution, setting of a pH of 8 by introduction of ammonia, dropwise addition of potassium permanganate solution with continual stirring, and filtering-off of the coated particles.

As another example, some embodiments include a process for producing particles as described herein, characterized in that particles coated with antimony-tin oxide are used and these are coated with manganese oxide using a process for atomic layer deposition (ALD), with the following steps being run through in the order indicated: deposition of manganese precursors as first reactant, introduction of water vapor as second reactant, and oxidation of the manganese precursor in the presence of oxygen.

In some embodiments, the process is carried out in a fluidized-bed reactor.

BRIEF DESCRIPTION OF THE DRAWINGS

The working examples described below are embodiments of the teachings herein. In the working examples, the components described for the embodiments are in each case individual features of the disclosure which should be viewed as independent of one another and also develop the teachings further independently of one another and should therefore also be regarded, either individually or in a combination other than that shown, as constituent part of the teachings. Furthermore, the embodiments described can also be supplemented by further features, as described above, of the disclosure. In the figures.

DETAILED DESCRIPTION

Figure 1:
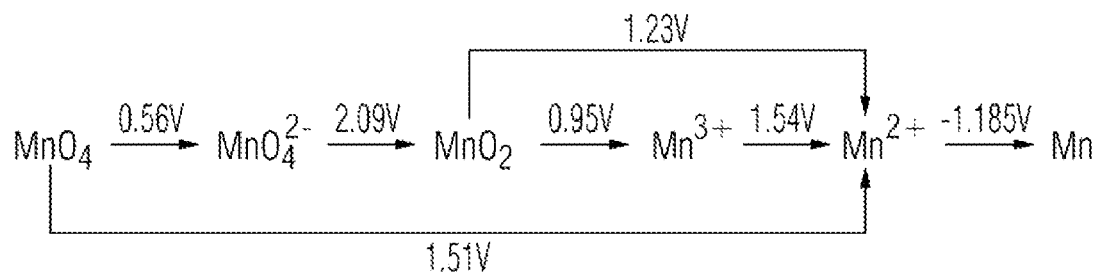
FIG. 1 shows various standard potentials of manganese.

Some embodiments of the present disclosure include particles equipped with a layer which contains both antimony-tin oxide and manganese oxide. Such a composition of the material of the layer on the particles displays an excellent antimicrobial action. For this purpose, studies have been carried out and have given the following results.

The precipitates were painted onto a glass support and the material surfaces were tested for antimicrobial effectiveness according to the standard ASTM E 2180-01. Gram-positive bacteria, *Staphylococcus aureus* ATOC 6538, and Gram-negative bacteria, *Escherichia coli* ATOC 8739, were used as test organisms. Immediately after initial drying of the cells on the surfaces (0 h), a significant reduction in the bacteria is observed, which is attributable to rapid inactivation of the germs and pronounced biocidal effectiveness of $MnO_2$/ATO on titanium dioxide needles in a moist medium. After an incubation time of four hours, 99.99% of the germs had been killed, which indicates that an antimicrobial action is also displayed under dry conditions.

Three parallel batches were contaminated for each material and also each point in time of sampling. The following control was also carried out: 0.2 ml of the germ suspension was transferred directly into a screw-cap test tube containing 10 ml of TSB and worked up further as above; this gave information about the efficiency of flushing of germs from the test surfaces.

The following samples were examined:
1) comparative sample $SnO_2$ on titanium dioxide needles; hereinafter referred to as $SnO_2$; and
2) antimicrobial particles $SnO_2$/$MnO_2$ on titanium dioxide needles; hereinafter referred to as $SnO_2$/$MnO_2$.

Three parallel batches were contaminated for each material and also each point in time of sampling. The following control was also carried out: 0.2 ml of the germ suspension was transferred directly into a screw-cap test tube containing 10 ml of TSB and worked up further as above; this gave information about the efficiency of flushing of germs from the test surfaces. Table 1 reports the KBE recovered from the surfaces at the different times for *Escherichia coli*. Table 2 shows the corresponding results for *Staphylococcus aureus*. Table 3 shows the total numbers of germs applied to the surfaces, while table 4 shows the germs recovered from the different material surfaces at the different incubation times, based on the total numbers of germs applied to the surfaces.

TABLE 1

Bactericidal action of different materials on Escherichia coli; the total germs recovered from the material surfaces (average from the parallel tests) are reported; germs applied: $2.54 \times 10^6$

| Material | Incubation time | |
|---|---|---|
| | 0 h | 4 h |
| $SnO_2$ | $4.17 \times 10^4$ | $1.90 \times 10^3$ |
| $SnO_2$/$MnO_2$ | $5.05 \times 10^4$ | $<1.00 \times 10^1$ |

TABLE 2

Bactericidal action of various materials on Staphylococcus aureus; the total germs recovered from the material surfaces (average from the parallel tests) are reported; germs applied: $9.52 \times 10^6$

| Material | Incubation time | |
|---|---|---|
| | 0 h | 4 h |
| $SnO_2$ | $5.09 \times 10^5$ | $2.20 \times 10^4$ |
| $SnO_2$/$MnO_2$ | $5.44 \times 10^5$ | $<1.00 \times 10^1$ |

TABLE 3

Amount of germs applied to the material surfaces

| Test organism | Cell count applied |
|---|---|
| Escherichia coli | $2.54 \times 10^6$ |
| Staphylococcus aureus | $9.52 \times 10^6$ |

TABLE 4

Percentage germ recovery rates from different material surfaces after different incubation time, based on the germs applied.

| | Escherichia coli incubation time | | Staphylococcus aureus incubation time | |
|---|---|---|---|---|
| Material | 0 h | 4 h | 0 h | 4 h |
| $SnO_2$ | 1.64% | 0.07% | 5.35% | 0.23% |
| $SnO_2$/$MnO_2$ | 1.99% | <0.01% | 5.71% | <0.01% |

In some embodiments, the particles have the shape of flakes and/or platelets and/or needles. These particle shapes have a large aspect ratio. In other words, these particle shapes have a comparatively large surface area which is available for coating relative to the mass. A comparatively strong antimicrobial action can therefore be achieved with minimal use of material, since the surface area of said layer is of importance for this antimicrobial action.

In some embodiments, the layer consists of an inner sublayer of antimony-tin oxide and a porous outer sublayer of manganese oxide. Particles which have already been coated by manufacturers with antimony-tin oxide can be used as semifinished parts for coating with manganese oxide. The layer system is, owing to the porosity, nevertheless suitable for producing the described antimicrobial properties because the antimony-tin oxide is effective due to the porosity of the manganese oxide.

In the following, the manganese oxide will also be referred to as pyrolusite. The term "pyrolusite" should in the context of the present disclosure be understood as a group of minerals comprising the possible manganese oxides. The antimony-tin oxide will hereinafter also be abbreviated to ATO.

In some embodiments, there is a material for producing a coating, which comprises a matrix material and particles for embedding in a matrix which can be formed from this matrix material in different ways. In some embodiments, the particles have the above-described structure, i.e. they have a layer containing both antimony-tin oxide and manganese oxide. In some embodiments, the layers produced from this material likewise have antimicrobial properties since the particles built into the layer have this property at least at the surface of the component produced or the coating.

In some embodiments, the matrix material can consist of a granulated polymer. Granulated polymers are used in industry for producing polymer parts on a large scale. For this purpose, the granulated polymers are melted and processed in suitable machines to give polymer parts (for example by injection molding). Here, the particles can be built into the matrix of the component as it is being formed. This advantageously gives rise to antimicrobial properties at the surface of the component.

In some embodiments, the particles, which are very much smaller than the grains of the granulated polymer, may be attached to the surface of the granulated polymer, i.e. to the grains of the granulated polymer. This can result in the particles being able to be embedded reliably in the component to be produced. The concentration of particles to be achieved in the component to be produced (or in a polymer coating to be produced) can also be set by the occupation of the surface of the grains of the granulated polymer.

In some embodiments, the matrix material can consist of a surface coating composition in which the particles are dispersed. Surface coating compositions are used on a large scale for coating components, giving a surface coating composition layer by evaporation of a solvent of the surface coating composition and a pigment of the surface coating composition being fixed to the surface. Part of this pigment is the above-described particles having an antimicrobial action, with this action also being able to be utilized on the surface of the surface coating composition layer.

In some embodiments, the matrix material to be present in ionized form in an electrolyte, with the particles being dispersed in the electrolyte. In this way, it is possible to produce a coating on a component by an electrochemical route, with the dispersed particles being incorporated into this coating. During electrolytic coating, the matrix material is deposited from the electrolyte onto the component to be coated. This expediently makes it possible to produce, for example, metallic layers whose antimicrobial properties are improved by incorporation of the particles.

All materials which have been described in more detail above are also suitable for producing components or layers in such a way that the antimicrobial properties are retained even when the surface is worn. This can be explained by the fact that the particles are provided in the entire matrix of the component or of the coating and for this reason fresh particles, whose antimicrobial properties can be brought to bear when the particles are exposed, are continually exposed when material is removed from the surface.

In some embodiments, there is process in which particles which have previously been coated with antimony-tin oxide are used and these are wet-chemically coated with manganese oxide using what is known as a symproportionation-precipitation process, with the following steps being run through in the order indicated: suspension of the particles in water, introduction of the particle suspension obtained in this way into a manganese(II) nitrate solution, setting of a pH of 8 by introduction of ammonia, dropwise addition of potassium permanganate solution with continual stirring (over up to 4 hours), and filtering-off of the coated particles. An economical process for producing the particles already described in more detail above is provided thereby.

In some embodiments, there is process in which particles coated with antimony-tin oxide are used and these are coated with manganese oxide using a process for atomic layer deposition (also referred to as ALD). Here, the following steps are run through in the order indicated: deposition of manganese precursors as first reactant, introduction of water vapor as second reactant, and oxidation of the manganese precursor in the presence of oxygen.

In some embodiments, this process can be carried out using a fluidized-bed reactor. The use of the ALD process has the advantage that very thin layers can be deposited with high precision thereby. As a result, the catalytic properties of the antimicrobial layer can be obtained with minimal consumption of material.

Further particular teachings of the disclosure are described below with reference to the drawing. Identical or corresponding elements of the drawing are in each case provided with the same reference numerals and are only repeatedly described to the extent that there are differences between the individual figures.

Figure 2:
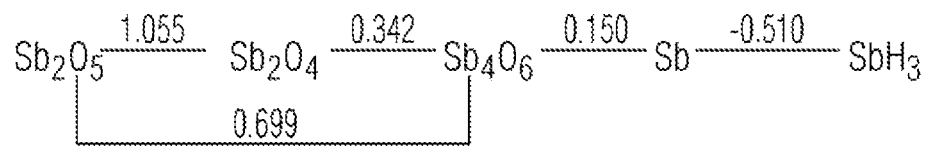
FIG. 2 shows various standard potentials of antimony.

An antimicrobial layer can be produced by means of the following measures. Two metal oxides are provided as antimicrobially active substances on a support material. The metal oxides are selected on the basis of their electrochemical behavior, taking into account the standard electrode potentials as shown in FIGS. 1 and 2 (in addition to the standard electrode potential of tin, see below), in such a way that one metal oxide acts as microcathode composed of pyrolusite and the other metal oxide acts as microanode composed of antimony-tin oxide (ATO). Pyrolusite is, according to the standard potential, more noble than antimony-tin oxide. In the presence of moisture, an electric field is formed between the metal oxides. Redox processes can therefore occur at the metal oxides and microbes can be killed by electron transitions which take place.

Standard potential of tin:

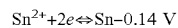

Figure 3:
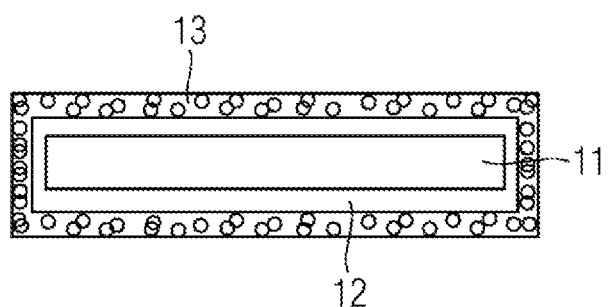
FIG. 3 shows a working example of a particle incorporating teachings of the present disclosure, configured as titanium oxide needle, with this being coated with ATO and porous pyrolusite.

Particle geometries having high aspect ratios, e.g., needles, flakes, platelets, may be selected as support materials. Titanium dioxide needles are selected as working example. Antimicrobially active surfaces can be produced on titanium dioxide needles by wet chemical or physicochemical processes (e.g. atomic layer deposition). Titanium dioxide needles which have previously been provided with an antimony-tin oxide layer are obtainable with various length and width ratios from the company Ishihara. For coating, titanium dioxide needles with the designation FT1000, which are 0.13 μm wide and 1.68 μm long (see FIG. 3), were used in the working example.

In some embodiments, the particles are produced, for example, by means of wet chemical production of antimicrobial surfaces composed of metal oxides on titanium dioxide needles. On the titanium dioxide needles (needles 11 in FIG. 3), the antibacterial action is produced by the metal oxides antimony-tin oxide (ATO) and pyrolusite. Since the manufacturer supplies titanium dioxide needles having an inner sublayer 12 of ATO, these needles are deposited wet-chemically with an outer sublayer 13 of manganese dioxide by a symproportionation-precipitation process.

For this purpose, needles are suspended in water. The TiO$_2$ needle suspension is slowly added while stirring to a manganese(II) nitrate solution. When the entire suspension is present in the manganese(II) nitrate solution, a pH of 8 is set by means of ammonia. Potassium permanganate solution is subsequently added dropwise to the TiO$_2$—Mn(II)-NO$_3$ mixture. This mixture of TiO$_2$ needles, Mn(NO$_3$)$_2$, NH$_3$ and KMnO$_4$ is stirred for a number of hours. The titanium dioxide needles coated with pyrolusite are filtered off and washed. The precipitate is dried for 24 hours overnight at 110° C. in the presence of air. It is then calcined at 425° C. for a number of hours.

Pyrolusite is deposited on the ATO of the titanium dioxide needles by symproportionation of the components manganese(II) nitrate and permanganate by precipitation according to equation 1.

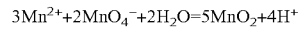 Equation 1

An intermediate oxidation state is formed from a higher oxidation state and a lower oxidation state of two Mn atoms by simultaneous oxidation of Mn$^{2+}$ and reduction of Mn$^{7+}$.

In some embodiments, the production of the coated particles is, as an alternative, also successfully effected by physicochemical deposition. An alternative to wet-chemical coating is, for example, atomic layer deposition (ALD).

Here, the needles are coated with manganese oxide from the gas phase via manganese precursors and water vapor as second reactants. As manganese precursors, it is possible to use bis(ethylcyclopentadienyl)manganese(II) or bis(N,N-diisopropylpentylamidinato)manganese(II).

Figure 4:
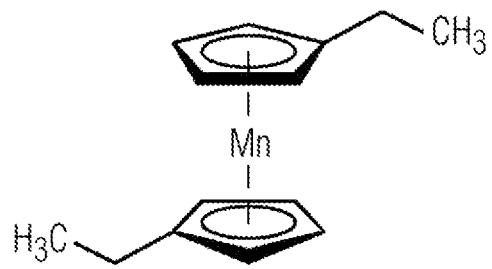
FIGS. 4 and 5 show various starting materials for producing a working example of the layer of the invention by an ALD process, in each case represented by structural formulae.

FIG. 4 shows the structure of bis(ethylcyclopenta-dienyl)manganese(II), referred to as $Mn(CpEt)_2$ for short. The manganese-dicyclopentadienyl complex is very reactive. The bond between the cyclopentadienyl anion (Cp) and the manganese is very weak.

Figure 5:
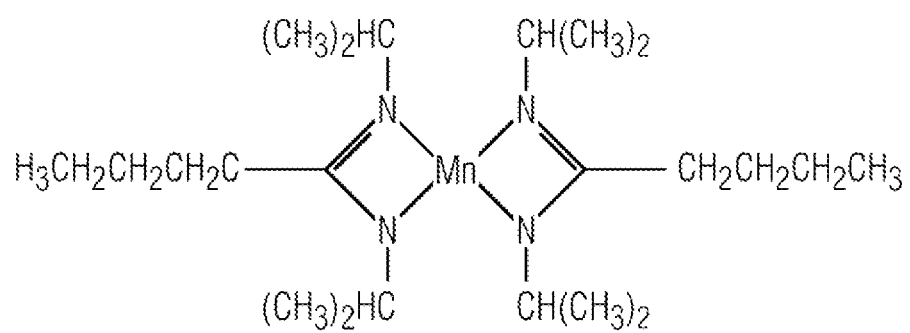

FIG. 5 shows the structure of bis(N,N-diisopropylpentylamidinato)manganese(II). Manganese coordinates to the amidinate ligands via the nitrogen atoms to form a four-membered chelate ring structure. Due to the complex-forming effects of the amidinate ligands, the manganese amidinate is stable at room temperature but is very reactive in the presence of oxygen and water vapor. The metal-nitrogen bonds and the C—N bonds in the ligand are suitable intended fracture positions because the branched hydrocarbon radicals on the N atom attract the bonding electrons more strongly than the manganese atom and thus have a lower bond energy compared to C—H and C—C bonds. Fragmentation of the Mn-amidinate occurs at the manganese-nitrogen bond. In the presence of water vapor, the Mn-amidinate complex decomposes into manganese oxide, the volatile acetamidine, isopropanol and n-propanol.

Figure 6:
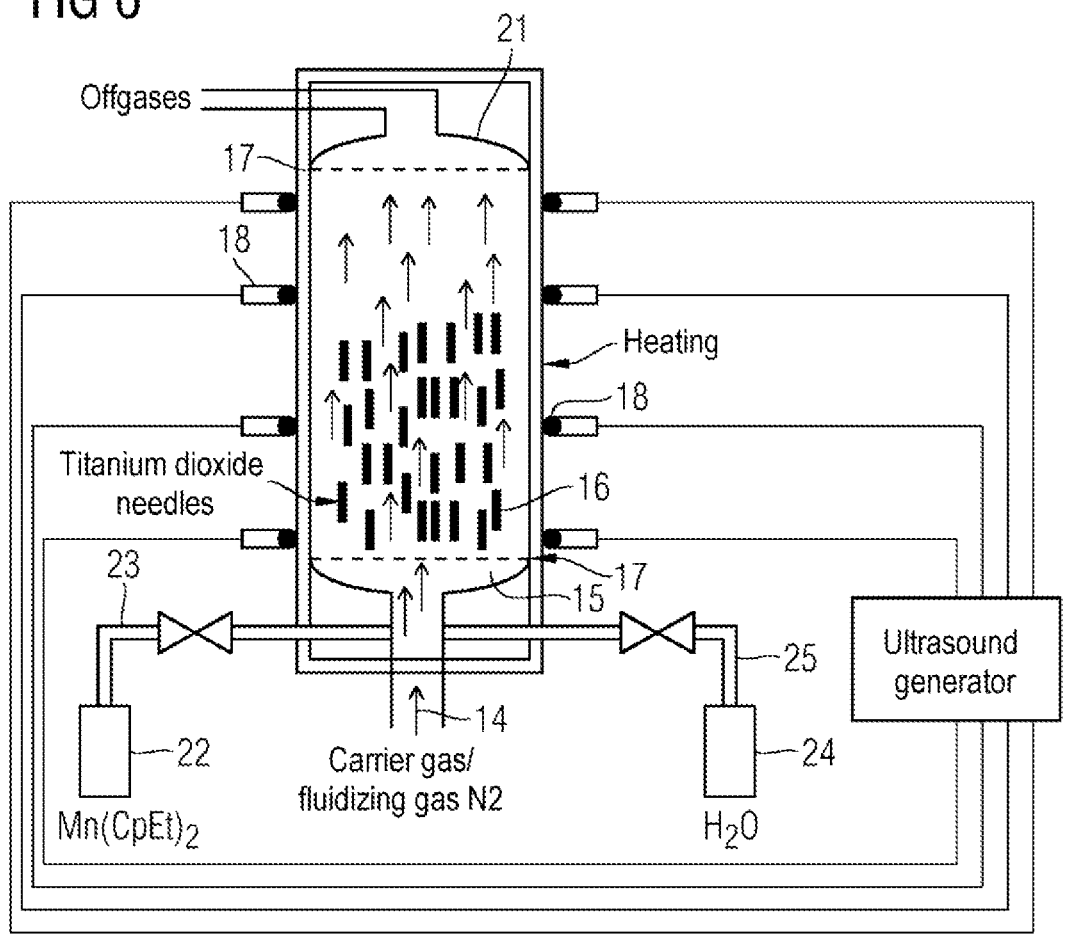
FIG. 6 shows a working example of a production process incorporating teachings of the present disclosure involving ALD deposition.

Process sequence: The titanium dioxide needles having an ATO layer are placed in a fluidized-bed reactor (FBR). Such a fluidized-bed reactor is depicted in FIG. 6. The gas 14, which acts as fluid, enters the reactor through a distributor 15 which is located at the bottom of a vacuum chamber 21 of the reactor. The gas flows upward through the particle bed and on its way exerts an upward-directed force on the particles 16 (titanium oxide needles). The titanium dioxide needles would otherwise be pulled downward by their own weight and gravitational force. The gas flow should be selected so that the forces acting upward and downward are balanced and a fluidized state arises. To prevent the titanium dioxide needles from being sucked out or blown out from the reactor, particle filters 17 are located both at the bottom and the top in the FBR.

To overcome the agglomeration forces between the needles, supplementary methods are necessary for a fluidized state to be established. Vibration of the fluidized bed can be effected by ultrasonic transducers 18 which are installed on the outer wall of the FBR and are controlled and regulated by means of an ultrasound generator 19. When the titanium dioxide needles are present in the reactor, a fine vacuum of $10^{-3}$ mbar is set in the reactor by means of a pump. This means that the air is pumped out. The needles are then brought into a fluidized state by introduction of inert gas. In the fluidized state, the reactor space is heated to from 140 to 230° C. by thermal radiation. For this purpose, a heating sleeve 20 is present outside the reactor.

$Mn(CpEt)_2$ is firstly stored in a bubbler 22 as protection against atmospheric oxygen and atmospheric moisture and secondly heated to 80-90° C. by means of a thermostatic bath (not shown). The bubbler 22 is equipped with a feed tube and a offtake tube 23. Carrier gas (nitrogen) goes via the feed tube into the bubbler and mixes there with the $Mn(CpEt)_2$ vapor. The nitrogen precursor vapor leaves the bubbler via the offtake tube 23 and is pneumatically conveyed with the aid of valves through the offtake tube into the FBR. The $Mn(CpEt)_2$ flow into the FBR is monitored and controlled by means of the vapor pressure of the precursor and the regulated flow of the $N_2$ carrier gas in such a way that a monolayer of $Mn(CpEt)_2$ is chemisorbed onto the ATO surface (not depicted, cf. FIG. 3) of the titanium dioxide needles.

In a second step, excess $Mn(CpEt)_2$ gas molecules are removed and the FBR is flushed with nitrogen.

In a third step, water vapor is conveyed as second reactant from a stock vessel 24 through a conduit 25 into the FBR. The water vapor immediately reacts with the $Mn(CpEt)_2$ complex to form manganese oxide and the volatile ethylcyclopentadiene. The fragmentation of the $Mn(CpEt)_2$ complex occurs between the manganese atom and the negatively charged, aromatic five-membered ring system.

In a fourth step, the volatile ethylcyclopentadiene and the excess water vapor are removed. The vacuum vessel and the coated needles are flushed with nitrogen.

The deposition processes described and the two flushing/evacuation processes between the layer-forming steps comprise a deposition cycle which is repeated a number of times. Each individual process proceeds to completion. The $Mn(CpEt)_2$ and the water vapor are introduced sequentially into the FBR chamber and chemisorbed on the ATO surface of the titanium dioxide needles until the entire ATO surface is occupied. No further adsorption processes then take place. The duration of the individual steps is selected so that the component which has just been introduced reacts in an adequate time with the ATO surface and the excess vapor and also the by-products are removed from the vacuum chamber 21. The adsorption time of $Mn(CpEt)_2$, the dissociation time into MnO and ethylcyclopentadiene and flushing times between the layer-forming processes are in the order of seconds. In this way of carrying out the process, the surface reactions limit themselves, so that a reproducible manganese oxide layer is deposited as outer sublayer 13 having a calculatable composition. The manganese oxide deposited grows with each subsequent cycle.

The number of process cycles necessary, the time for which the coating reactants act and the amount of bis(ethylcyclopentadienyl)manganese(II) and water vapor per unit area and cycle depend on the size (width and length) and number of the titanium dioxide needles and layer thickness of the manganese dioxide.

The reaction (equation 2) of $Mn(CpEt)_2$ with water vapor is:

$$Mn(CpEt)_2 + H_2O = MnO + 2HCpEt \quad \text{Equation 2}$$

The titanium dioxide needles coated with manganese(II) oxide are subsequently calcined at 425° C. in the presence of atmospheric oxygen for a number of hours in order to obtain pyrolusite.

Figure 7:
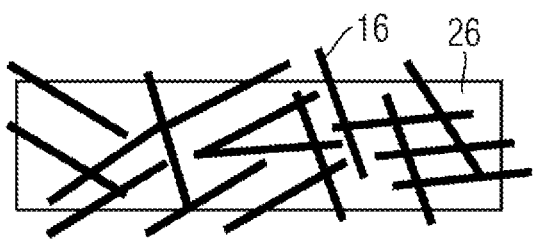
FIGS. 7 and 8 show a surface coating composition comprising a working example of particles incorporating teachings of the present disclosure which are dispersed in this surface coating composition, compared to a surface coating composition according to the prior art having round particles, in each case depicted in section.
Figure 8:
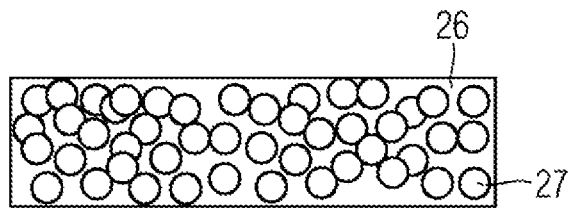

FIG. 7 and FIG. 8 show various working examples of components or layers according to the invention which have a matrix 26 composed of, for example, polymer. Particles 16 are accommodated in the form of coated titanium oxide needles in this matrix in FIG. 7. In FIG. 8, flakes 27 are used as an alternative to titanium oxide needles. It can clearly be seen that both the flakes 27 and the particles 16 are exposed at the surface and can in this way display their antimicrobial properties.

LIST OF REFERENCE NUMERALS

11 Needles
12 Inner sublayer (ATO)
13 Outer sublayer (pyrolusite)
14 Gas
15 Distributor
16 Particles 17 Particle filter
18 Ultrasonic transducer
19 Ultrasound generator
20 Heating sleeve
21 Vacuum chamber
22 Bubbler
23 Offtake tube
24 Stock vessel
25 Conduit
26 Matrix
27 Flakes

What is claimed is:

1. Particles comprising:
an antimicrobial surface; and
a layer comprising antimony-tin oxide and manganese oxide.

2. The particles as claimed in claim 1, wherein the particles comprises at least one of: flakes, platelets, and needles.

3. The particles as claimed in claim 1, wherein the layer comprises an inner sublayer of antimony-tin oxide and a porous outer sublayer of manganese oxide.

4. A material comprising:
a matrix material; and
particles for embedding in a matrix formed of the matrix material;
wherein the particles comprise: an antimicrobial surface; and a layer comprising antimony-tin oxide and manganese oxide.

5. The material as claimed in claim 4, wherein the matrix material comprises a granulated polymer.

6. The material as claimed in claim 5, wherein the particles are attached to a surface of the granulated polymer.

7. The material as claimed in claim 4, wherein the matrix material comprises a surface coating in which the particles are dispersed.

8. The material as claimed in claim 4, wherein:
the matrix material comprises ions in an electrolyte; and
the particles are dispersed in the electrolyte.

9. A process for coating antimony-tin oxide particles with manganese oxide process comprising:
suspending the antimony-tin oxide particles in water;
introducing a resulting particle suspension into a manganese(II) nitrate solution;
setting a pH of the combined solution at 8 by adding ammonia;
adding dropwise potassium permanganate solution with continual stirring; and
filtering-off coated particles.

10. A process for coating antimony tin oxide particles with manganese oxide, the process comprising:
depositing manganese precursors as a first reactant;
introducing water vapor as a second reactant; and
oxidizing the manganese precursor in the presence of oxygen.

11. The process as claimed in claim 10, wherein the process is carried out in a fluidized-bed reactor.

* * * * *